United States Patent
Le et al.

(10) Patent No.: US 8,941,954 B2
(45) Date of Patent: Jan. 27, 2015

(54) MAGNETIC SENSOR WITH EXTENDED PINNED LAYER AND PARTIAL WRAP AROUND SHIELD

(71) Applicant: HGST Netherlands B.V., Amsterdam (NL)

(72) Inventors: Quang Le, San Jose, CA (US); Simon H. Liao, Fremont, CA (US); Guangli Liu, Pleasanton, CA (US); Kochan Ju, Monte Sereno, CA (US); Youfeng Zheng, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/720,942

(22) Filed: Dec. 19, 2012

(65) Prior Publication Data
US 2014/0168822 A1    Jun. 19, 2014

(51) Int. Cl.
*G11B 5/39*    (2006.01)
*G11B 5/31*    (2006.01)
*G11B 5/56*    (2006.01)

(52) U.S. Cl.
CPC ............... *G11B 5/3156* (2013.01); *G11B 5/56* (2013.01)
USPC .................................. 360/324.12; 360/319

(58) Field of Classification Search
USPC .......... 360/324.11, 324.12, 324.2, 324.1, 319
See application file for complete search history.

(56) References Cited

U.S. PATENT DOCUMENTS

| | | | |
|---|---|---|---|
| 7,420,787 B2 | 9/2008 | Freitag et al. | |
| 7,522,391 B2 | 4/2009 | Freitag et al. | |
| 7,663,846 B2 | 2/2010 | Freitag et al. | |
| 7,978,441 B2 | 7/2011 | Lin et al. | |
| 2001/0024347 A1* | 9/2001 | Shimazawa et al. | 360/324.2 |
| 2002/0097537 A1* | 7/2002 | Shimazawa | 360/324.2 |
| 2006/0132989 A1* | 6/2006 | Zhang et al. | 360/324.12 |
| 2006/0285259 A1* | 12/2006 | Gill et al. | 360/324.12 |
| 2007/0133133 A1* | 6/2007 | Freitag et al. | 360/324.12 |
| 2007/0171572 A1* | 7/2007 | Wang et al. | 360/110 |
| 2008/0062584 A1 | 3/2008 | Freitag et al. | |
| 2009/0316308 A1* | 12/2009 | Saito et al. | 360/324.1 |

* cited by examiner

*Primary Examiner* — Jefferson Evans
(74) *Attorney, Agent, or Firm* — Zilka-Kotab, PC

(57) ABSTRACT

A magnetic read head that has improved pinned layer stability while also maintaining excellent free layer stability. The free layer has sides that define a trackwidth of the sensor and a back edge that defines a functional stripe height of the sensor. However, the pinned layer can extend significantly beyond both the width of the free layer and the back edge (e.g. stripe height) of the free layer. The sensor also has a soft magnetic bias structure that compensates for the reduced volume presented by the side extension of the pinned layer. The soft magnetic bias structure can be magnetically coupled with the trailing magnetic shield, either parallel coupled or anti-parallel coupled. In addition, all or a portion of the soft magnetic bias structure can be exchange coupled to a layer of antiferromagnetic material in order to improve the robustness of the soft magnetic bias structure.

15 Claims, 17 Drawing Sheets

MAGNETIC SENSOR WITH EXTENDED PINNED LAYER AND PARTIAL WRAP AROUND SHIELD

FIELD OF THE INVENTION

The present invention relates to magnetic data recording and more particularly to a magnetic read sensor with an extended pinned layer for improved pinning robustness.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresistive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the track width of the system as well as well as the bit length. With regard to the magnetic head, this means reducing the effective track width of the read head and reducing the magnetic spacing of the read head. However, physical limitations as well as manufacturing limitations have constrained the amount by which the track width and gap thickness of the magnetic read head can be reduced. In addition, such a reduction in read sensor size creates challenges with regard to pinned layer stability and free layer stability. Therefore, there remains a need for a magnetic read head that can provide such reduced track width and gap thickness while also remaining magnetically stable and reliable.

SUMMARY OF THE INVENTION

The present invention provides a magnetic read head that includes a sensor stack that has a magnetic free layer structure and a magnetic pinned layer structure. The free layer structure has a back edge that extends from an air bearing surface to a first stripe height and has first and second laterally opposed sides the distance between which defines a track-width. The pinned layer structure has a back edge that extends significantly beyond the first stripe height and also extends laterally significantly beyond the first and second sides of the free layer. First and second soft magnetic bias structures extend laterally outward from the first and second sides of the free layer structure.

The invention advantageously allows the pinned layer to be extended in both the stripe height and width directions, while also maintaining robust free layer biasing in spite of the reduced volume provided by extension of the pinned layer in the width direction. The invention can achieve this advantage in several ways, such as by making the bias structures soft magnetic and coupling them with the trailing shield structure. Also, either or both of the trailing shield and the hard bias structure can be exchange coupled with a layer of antiferromagnetic material to further improve the robustness of the free layer biasing.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIG. 3 is an air bearing surface view of a magnetic read sensor according to another embodiment of the invention;

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
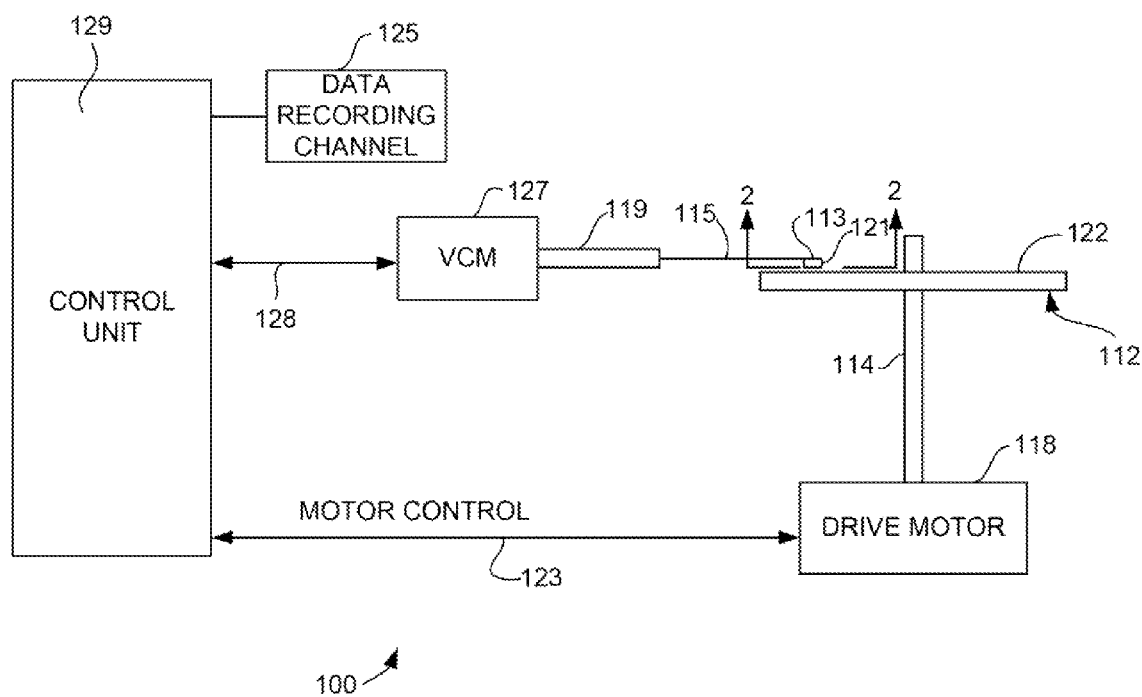
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 12 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
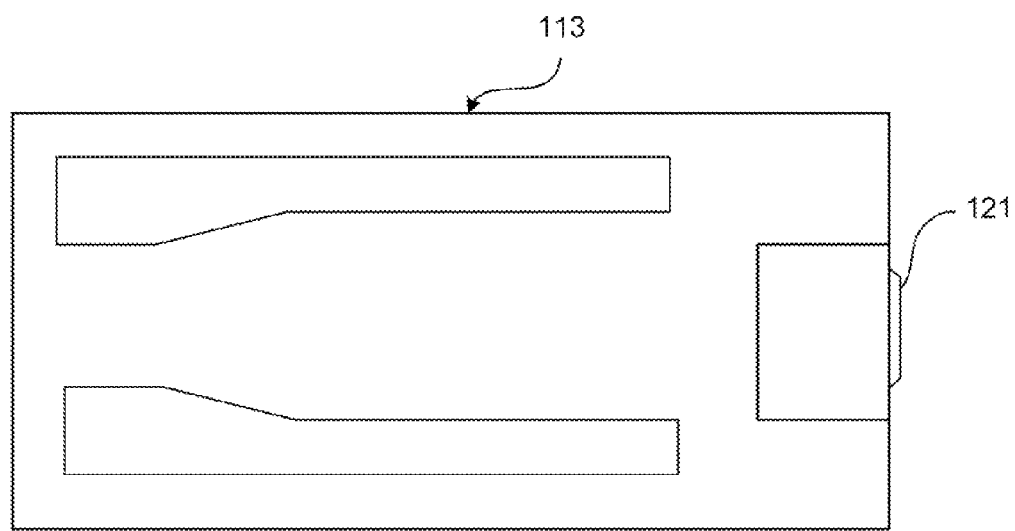
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
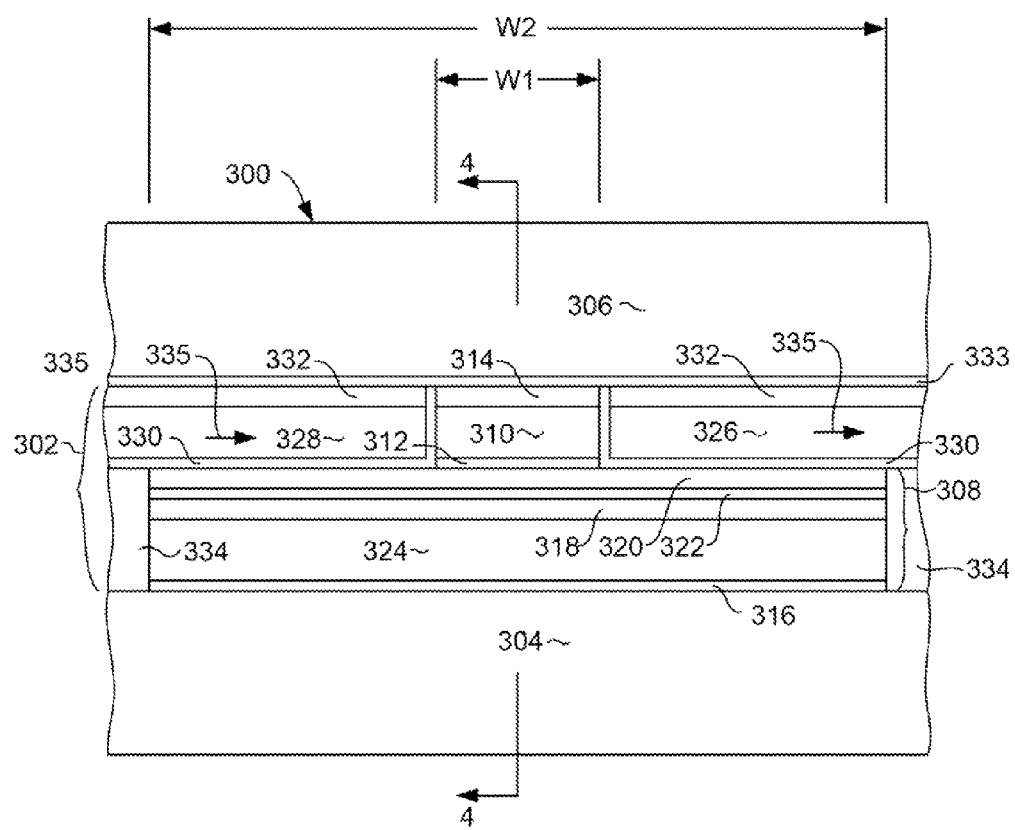
FIG. 3 is an air bearing surface view of a magnetic read sensor according to an embodiment of the invention.

FIG. 3 shows a schematic view of a magnetic read head 300 as viewed from the air bearing surface. The read head 300 includes a sensor stack 302 that is sandwiched between a leading magnetic shield 304 and a trailing magnetic shield 306. The sensor stack 302 includes a magnetic pinned layer structure 308, a magnetic free layer structure 310 and a non-magnetic barrier or spacer layer 312 sandwiched between the free and pinned layer structures 308, 310. If the sensor 302 is a tunnel junction (TMR) sensor, then the layer 312 can be a non-magnetic, electrically insulating barrier layer such as MgO. If the sensor 302 is a giant magnetoresistive (GMR) sensor, the layer 312 can be a non-magnetic, electrically conductive material such as AgSn. A capping layer 314 may be provided at the top of the sensor stack 302 to protect the under-lying layers during manufacture. A seed layer 316 may also be provided at the bottom of the sensor stack 302 to promote a desired grain structure in the other above applied layers of the sensor stack 302.

The pinned layer structure 308 can be an anti-parallel coupled structure that includes first and second magnetic layers 318, 320 that are anti-parallel coupled across a non-magnetic, anti-parallel coupling layer such as Ru 322. The first magnetic layer 318 contacts and is exchange coupled with a layer of antiferromagnetic material such as Ir—Mn. This exchange coupling pins the magnetization of the first magnetic layer 318 in a first direction that is perpendicular to the air bearing surface. The anti-parallel coupling between the first and second magnetic layers 318, 320 across the anti-parallel coupling layer 322 causes the magnetization of the second magnetic layer 320 to be pinned in a second direction perpendicular to the air bearing surface and opposite to the first direction.

The free layer 310 has a magnetization that is biased in a direction that is parallel with the air bearing surface and orthogonal to the directions of magnetization of the pinned layers 318, 320, but which is free to move in response to an external magnetic field. Biasing of the magnetization of the free layer 310 is provided by hard magnetic bias layers 326, 328, which can be constructed of a high magnetic coercivity material such as CoPt or CoPtCr. The hard bias layer 326, 328 are separated from the sensor stack 302 by non-magnetic, electrically insulating layers 330, which can be constructed of one or more layers of material such as alumina ($Al_2O_3$), SiN, TaOx, MgO, SiOxNy, or a combination thereof. A non-magnetic hard bias capping layer 332 can be provided at the top of each of the hard magnetic bias layers 326, 328. These capping layers 332 can be constructed of a material such as Ta/Ru, Ta/Cr, Ta/Rh, or a combination thereof, which protects the hard bias layers 326, 328. In addition, a decoupling layer 333 can be provided beneath the trailing shield 306 to magnetically decouple the trailing shield from the hard bias layers 326, 328. The hard bias layers 326, 328 have a magnetization that is oriented in a desired direction parallel with the ABS as indicated by arrows 335.

With continued reference to FIG. 3 it can be seen that the free layer 310 and overlying capping layer 314 have a first width W1, whereas the pinned layer structure 308 extends substantially beyond W1, to a second width W2. The first width W1 defines the functional track-width of the magnetic read element 300. The further extension of the pinned layer to the second width W2 promotes increased pinning strength to ensure that the pinned magnetization of the magnetic layers 318, 320 remain pinned in the correct directions perpendicular with the air bearing surface. The space extending beyond the pinned layer structure 308 (beyond W2) can be filled with a non-magnetic, electrically insulating fill material such as alumina ($Al_2O_3$) 334.

Figure 4:
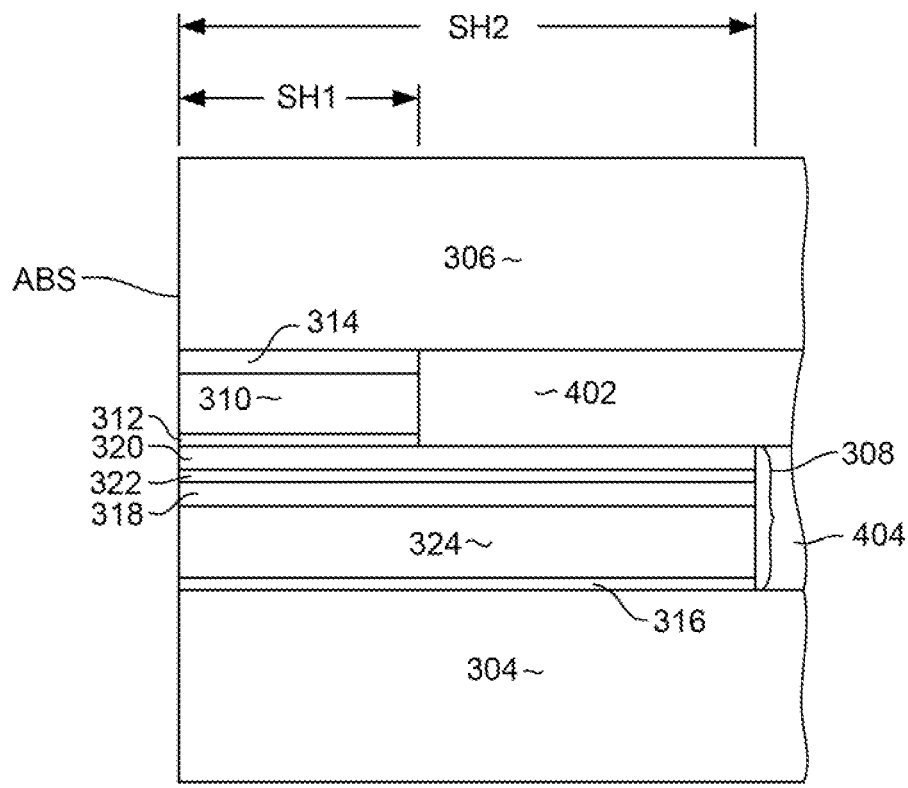
FIG. 4 is a side cross sectional view of the read sensor according to the embodiment of FIG. 3 as seen from line 4-4 of FIG. 3.

FIG. 4 shows a side cross sectional view of the read element 300 as taken from line 4-4 of FIG. 3. In FIG. 4, it can be seen that the free layer 310 and capping layer 314 extend to a first stripe height SH1 as measured from the air bearing surface (ABS), whereas the pinned layer structure 308 extends to a second stripe height SH2 as measured from the ABS that is much longer than the first stripe height SH1. This extension of the pinned layer to the second stripe height SH2 further improves pinning strength to ensure that the magnetizations of the magnetic layers 318, 320 of the pinned layer remain pinned in the desired direction perpendicular to the ABS. The shorter stripe height SH1 of the free layer 310 defines the functional stripe height of the sensor, and maintains the necessary magnetic properties of the free layer 310 such as the desired shape enhanced magnetic anisotropy to allow the magnetization to be reliably biased in a direction parallel with the ABS as previously discussed.

With continued reference to FIG. 4 the space beyond the first stripe-height SH1, behind the free layer 310 can be filled with a non-magnetic, electrically insulating fill layer such as alumina, SiN, TaOx, MgO, SiOxNy, or a combination thereof 402. Similarly, the space beyond the second stripe height SH2 can also be filled with a non-magnetic, electrically insulating fill material such as alumina, SiN, TaOx, MgO, SiOxNy, or a combination thereof 404.

Figure 5:
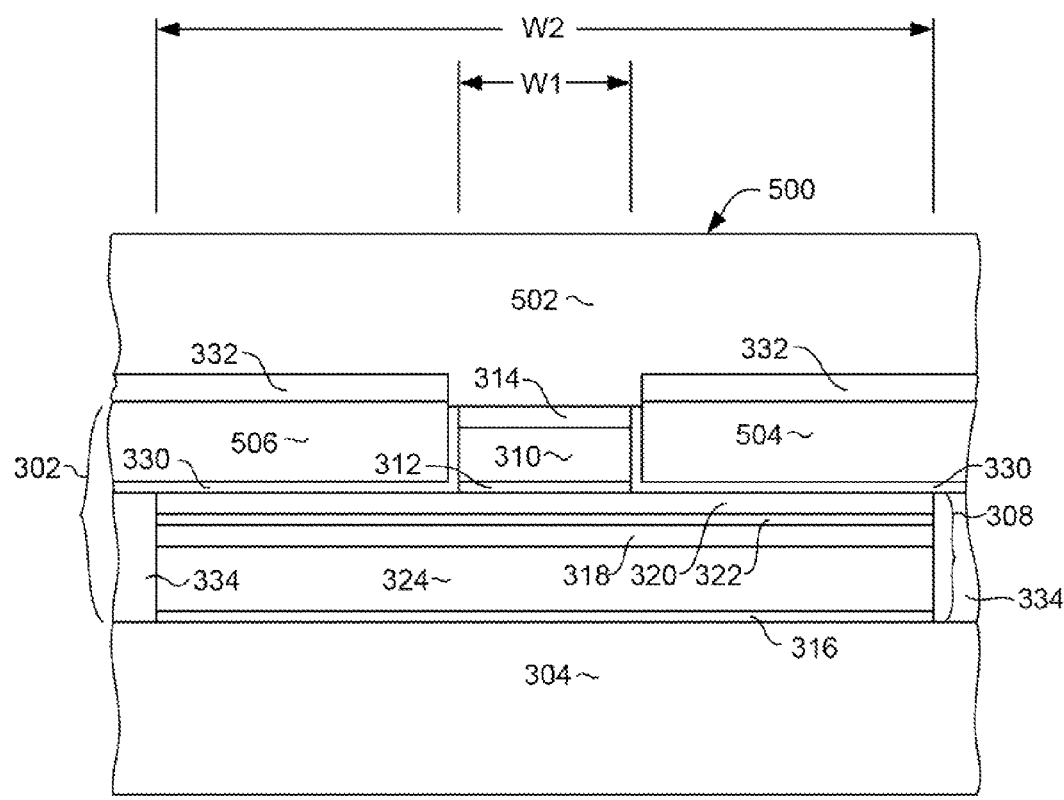

With reference again to FIG. 3 it can be seen that because the pinned layer structure 308 extends beyond W1, there is significantly less space for the hard bias layers 326, 328. This means that these layers have less thickness and can provide less magnetic bias field for biasing the free layer 310. This could lead to reduced free layer stability, especially at very small track-widths. FIG. 5 illustrates an embodiment that alleviates this problem.

FIG. 5 shows a view of an alternate embodiment of the invention as viewed from the air bearing surface. FIG. 5 shows a magnetic read element 500 (similar to FIG. 3) that includes a sensor stack 302 that is sandwiched between a leading magnetic shield 304 and trailing magnetic shield 502. The sensor stack 302 can be essentially the same as the sensor stack 302 described above with reference to FIGS. 3 and 4 and can have a pinned layer structure 308 that is extended in both the width (FIG. 3) and stripe height (FIG. 4) directions.

However, the read element 502 of FIG. 5 has a trailing magnetic shield 502 that is notched as shown, so that the shield extends downward toward the sensor stack 302 in the narrower region of the free layer 310 (W1) and is notched upward in the regions just beyond the free layer 310 (e.g. beyond W1). As can be seen, this shape of the trailing magnetic shield 502 provides additional space for thicker hard bias layers 504, 506. This allows the hard bias layers 504, 506 to be thicker even in though the pinned layer structure 308 is extended in the width direction. In this way, the hard bias layers 504, 506 can provide ample magnetic bias field for maintaining stable, reliable free layer biasing.

With reference again to FIG. 5 it can be seen that the notched shape of the trailing magnetic shield 502 provides additional space for thicker hard bias layers 504, 506 but this comes at the expense of achieving a flat shield.

Figure 6:
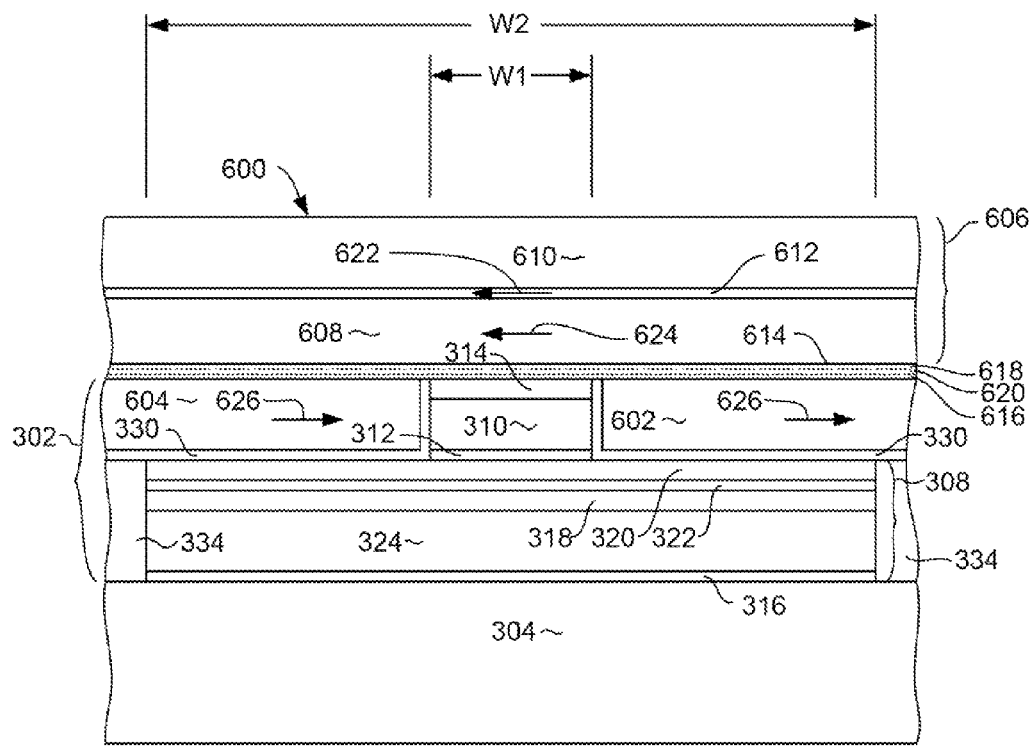
FIG. 6 is an air bearing surface view of a magnetic read sensor according to yet another embodiment of the invention.

Another approach to alleviate this problem is to replace the hard bias material with a soft bias structure, which would require less material for biasing and open more space by removing the hardbias cap and some of the hard bias seed layer. With reference to FIG. 6, an embodiment of the invention is illustrated that provides improved free layer biasing while also having a pinned layer structure that is extended in both the stripe height and width directions. FIG. 6 shows a magnetic read element 600 that includes a sensor stack 302 similar to that described above with reference to FIGS. 3, 4 and 5. As can be seen in FIG. 6 (like the other above described embodiments) the free layer 310 has a width W1 that defines a functional track-width of the read element 600, whereas the pinned layer 308 has a width that extends to a width W2 (as well as being extended in the stripe height direction as described above with reference to FIG. 4).

The present embodiment includes a shield structure 606 that includes a magnetic shield layer 610, a layer of antiferromagnetic material such as IrMn 612 and a high saturation (high Bs) material 608 that is exchange coupled with the antiferromagnetic layer 612 and which is arranged so that it is nearest to the bias layers 602, 604. The antiferromagnetic layer 612 has its magnetizations oriented in a first direction parallel to the ABS as indicated by arrow 622, and exchange coupling between the layer 612 and the high Bs layer 608 pins the magnetization of the layer 608 in the same first direction as indicated by arrow 624.

The sensor 600 also has magnetically soft bias layers 602, 604 that are anti-parallel coupled with the high Bs layer 606 across an anti-parallel exchange coupling layer 614. The anti-parallel exchange coupling layer can include a layer of Ru 620 sandwiched between first and second layers of CoFe 616, 618, the Ru layer 620 being of a thickness as to magnetically anti-parallel couple the layer 606 with each of the soft magnetic bias layers 602, 604. This anti-parallel coupling causes the magnetically soft bias layers 602, 604 to each have a magnetization that is oriented in a second direction parallel with the air bearing surface (opposite to 624, 622) as indicate by arrow 626. The magnetically soft bias layers 602, 604 and 606, 608 can be constructed of a single layer, bi-layer, or multilayer of soft magnetic material such as NiFe19, NiFe4, NiFe 19/NiFe4, NiFe4/NiFe19, NiFe17Mo5, NiFe55, NiFe19/NiFeMo, NiFeMo/NiFe19, CoFe25, or their alloys or a combination thereof, allowing the bias layers 602, 604 to function as side magnetic shields as well as providing a magnetic biasing function for biasing the free layer 310. Therefore, because the soft magnetic bias layers 602, 604 are magnetically anti-parallel coupled with the shield structure 606, the soft magnetic bias layers 602, 604 and shield 606 function as a wrap around magnetic shield.

Figure 7:
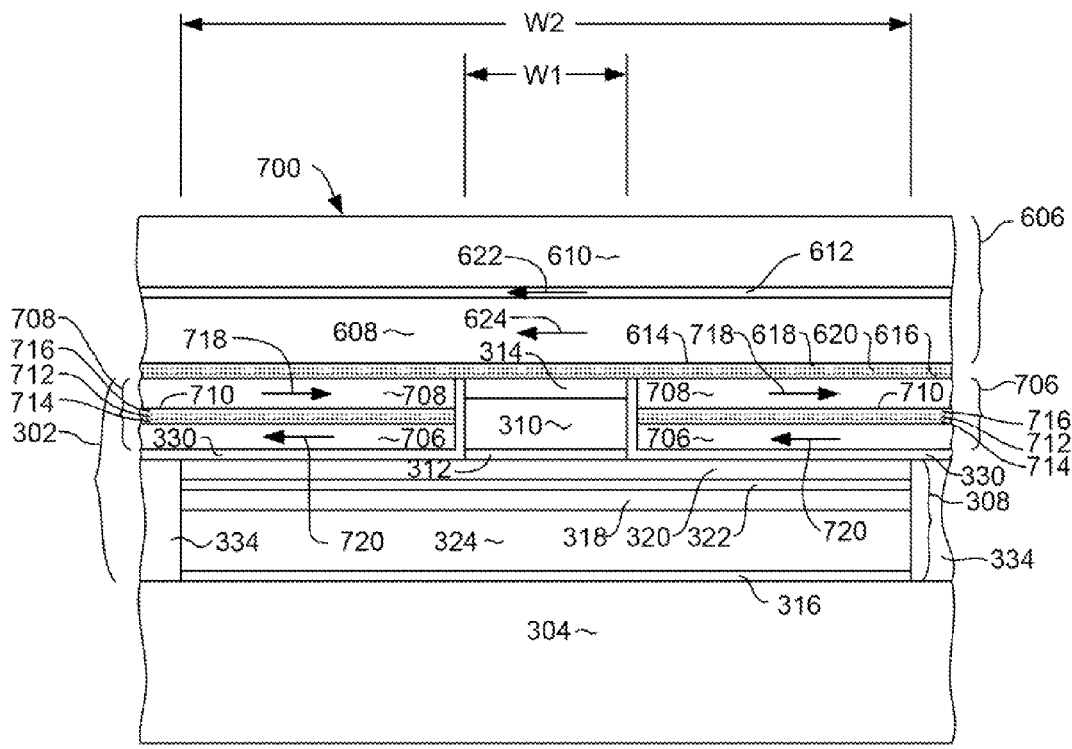
FIG. 7 is an air bearing surface view of a magnetic read sensor according to yet another embodiment of the invention.

With reference now to FIG. 7, a magnetic read head 700 according to another embodiment of the invention is illustrated. Like the previously described embodiment, the read head 700 has a trailing magnetic shield 606 that includes an anti-ferromagnetic layer 612 that is exchange coupled with a high Bs magnetic layer 608 both of which have magnetizations oriented parallel with the air bearing surface in a first direction as indicated by arrows 622, 624.

However, the magnetic read head 700 has first and second soft magnetic bias structures 702, 704 that are formed as anti-parallel coupled structures that each include first and second magnetically soft layers 706, 708 that are anti-parallel coupled across an anti-parallel exchange coupling layer 710. The anti-parallel exchange coupling layer 710 can be constructed as a layer of Ru 712 sandwiched between first and second layers of CoFe 714, 716. The upper soft magnetic layers 710 of each of the bias structures 706, 708 is anti-parallel coupled across the anti-parallel exchange coupling layer 614 so that it has a magnetization 718 that is oriented in a second direction parallel with the ABS (and opposite to 622, 624) as indicated by arrow 718. The anti-parallel coupling between the layers 708, 706 causes the layer 706 to have a magnetization that is opposite to 718, as indicated by arrow 720.

At very small track-widths a hard bias structure can provide too much biasing. By constructing the bias structure 706 as an anti-parallel coupled structure with one of the magnetic layers 706, 708 having being a high Bsat material and the other being a low Bsat material and adjusting the thicknesses of the magnetic layers 706, 708, a desired net bias field can be provided, while maintaining stable, robust biasing.

Figure 8:
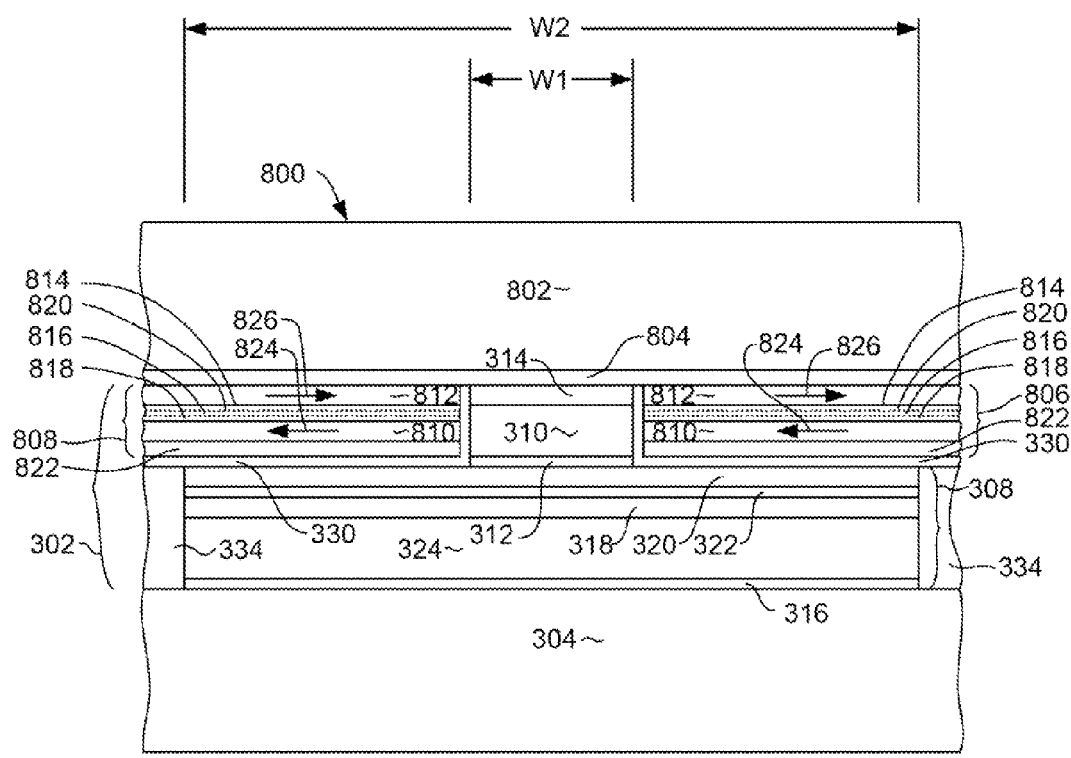
FIG. 8 is an air bearing surface view of a magnetic read sensor according to yet another embodiment of the invention.

With reference now to FIG. 8, a magnetic read head 800 according to still another embodiment of the invention is described. The read head 800 includes a trailing magnetic shield 802, which can be a shield such as the shield 300 described above with reference to FIG. 3. Also similar to the structure described above with reference to FIG. 3, a non-magnetic de-coupling layer 804 can be provided at the bottom of the shield 802. The de-coupling layer 804 can include a layer of Ru and a layer of NiFe.

The read head 800 also includes magnetically soft bias structures 806, 808. Each of the magnetic bias structures 806, 808 includes first and second soft magnetic layers 810, 812 that are anti-parallel coupled across an anti-parallel exchange coupling layer 814. As with the previously described embodiment, the anti-parallel exchange coupling layer 814 can include a layer of Ru 816 that is sandwiched between first and second layers of CoFe 818, 820. A layer of antiferromagnetic material such as IrMn 822 is exchange coupled with one of the magnetic layers (e.g. 810) to set the magnetization of that layer in a first direction parallel with the air bearing surface as indicated by arrow 824. Anti-parallel coupling between the first and second magnetic layers 810, 812 sets the magnetization of the other layer 812 in a second, opposite direction as indicated by arrow 826. This embodiment is similar to FIG. 7 in that it applies a similar approach to that discussed above with reference to FIG. 7 for reducing biasing field by inserting an anti-parallel exchange layer 814 and adjusting the thickness of the top and bottom magnetic layers 810, 812 and/or Bs value to reduce and adjust the bias field. This approach can be beneficial for TMR. Suitable materials for the layers 810, 812 include NiFe19, NiFe4, NiFe19/NiFe4, NiFe4/NiFe19, NiFe17Mo5, NiFe55, NiFe19/NiFeMo, NiFeMo/NiFe19, CoFe25, or a combination thereof.

Figure 9:
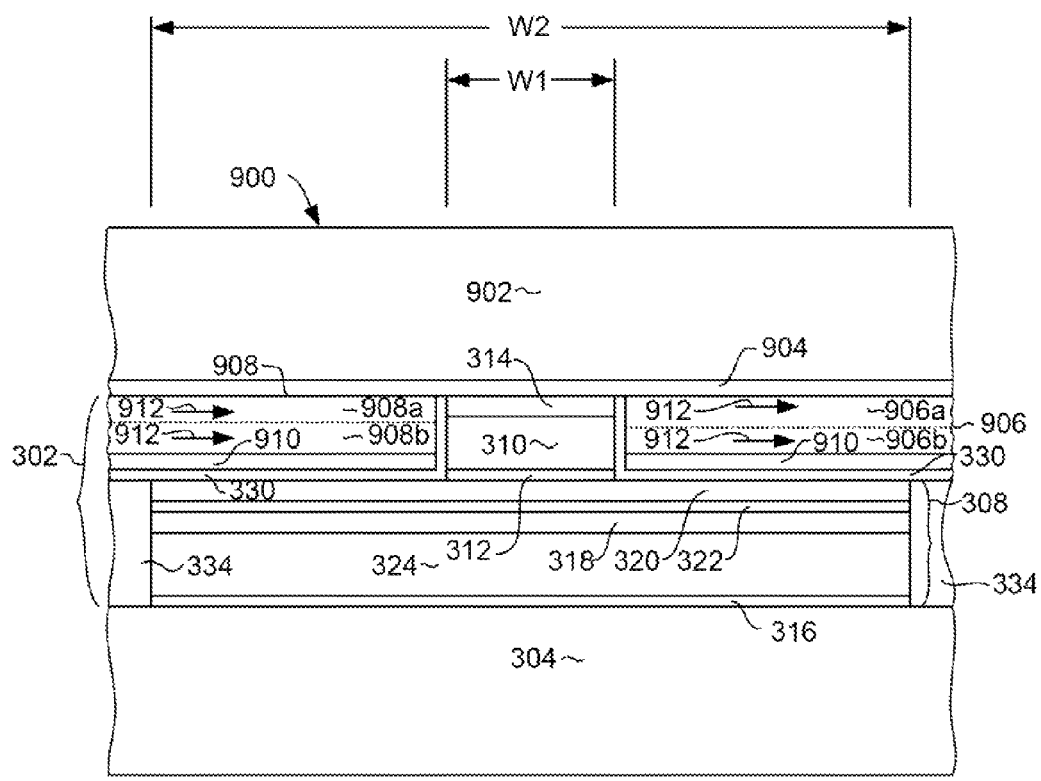
FIG. 9 is an air bearing surface view of a magnetic read sensor according to yet another embodiment of the invention.

With reference now to FIG. 9, a magnetic read head 900 according to yet another possible embodiment of the invention is described. This embodiment includes a trailing magnetic shield 902 and a de-coupling layer 904 formed at the bottom of the de-coupling layer in a manner similar to that described above with reference to FIGS. 3 and 8. This embodiment includes first and second soft magnetic bias layers 906, 908 that are exchange coupled with a layer of anti-ferromagnetic material 910 such as IrMn. The exchange coupling sets the magnetization of the soft magnetic bias structures 906, 908 in a direction parallel with the air bearing surface as indicated by arrows 912. In contrast to the previously described embodiments, the soft magnetic bias layers 906, 908 can be constructed as single magnetic structures magnetized in a single direction. This approach is similar to that described above with reference to FIG. 6. To reduce biasing field at very small sensor track-width dimensions, a bi-layer soft bias 906, 908 can be constructed with a top layer with lower Bs material 906a, 908a and bottom layer 906b, 908b with higher Bs material with different thicknesses of each layer to adjust biasing field. In this case, these magnetic layers would not be anti-parallel coupled, but would function magnetically as a single magnetic structure as shown in FIG. 9.

Figure 10:
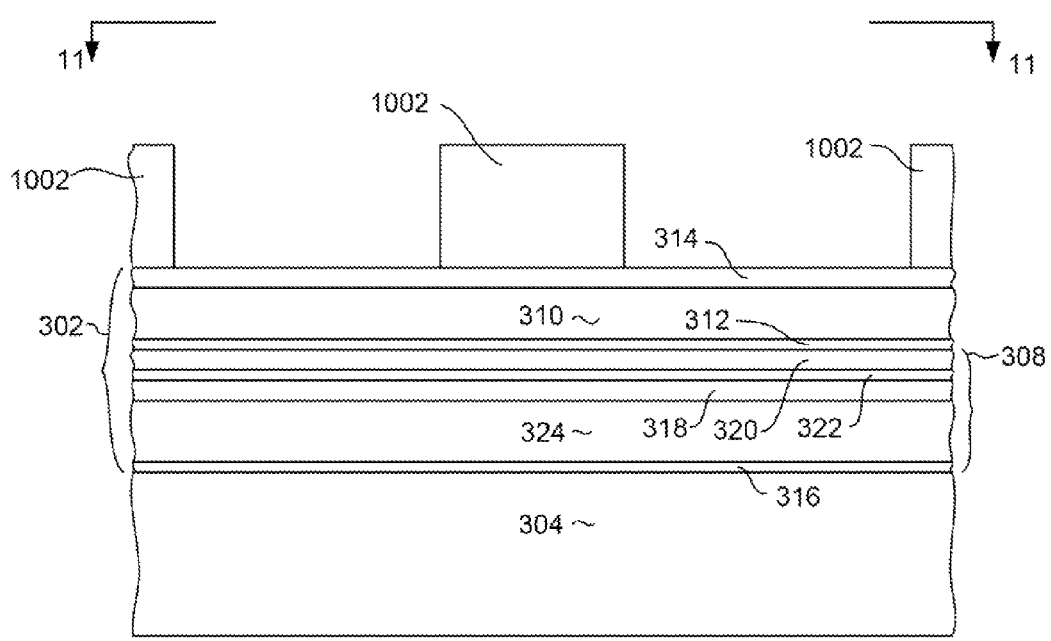
FIGS. 10-17 are views of a magnetic sensor in various intermediate stages of manufacture, illustrating a method of manufacturing a magnetic sensor according to an embodiment of the invention.

FIGS. 10-17 show a magnetic read head in various intermediate stages of manufacture and illustrate a method of manufacturing a magnetic read head according to an embodiment of the invention. With particular reference to FIG. 10, bottom magnetic shield 304 is formed, and a series of sensor layers 302 (e.g. 316, 324, 318, 320, 322, 312, 310, 314) are deposited, the sensor layers being denoted collectively as 302. These sensor layers can be the same as the sensor layers of the sensor stack 302 described above with reference to FIG. 3 or could be sensor layers of some other magnetic sensor structure. A first mask structure 1002 is then formed over the sensor layers 302.

Figure 11:
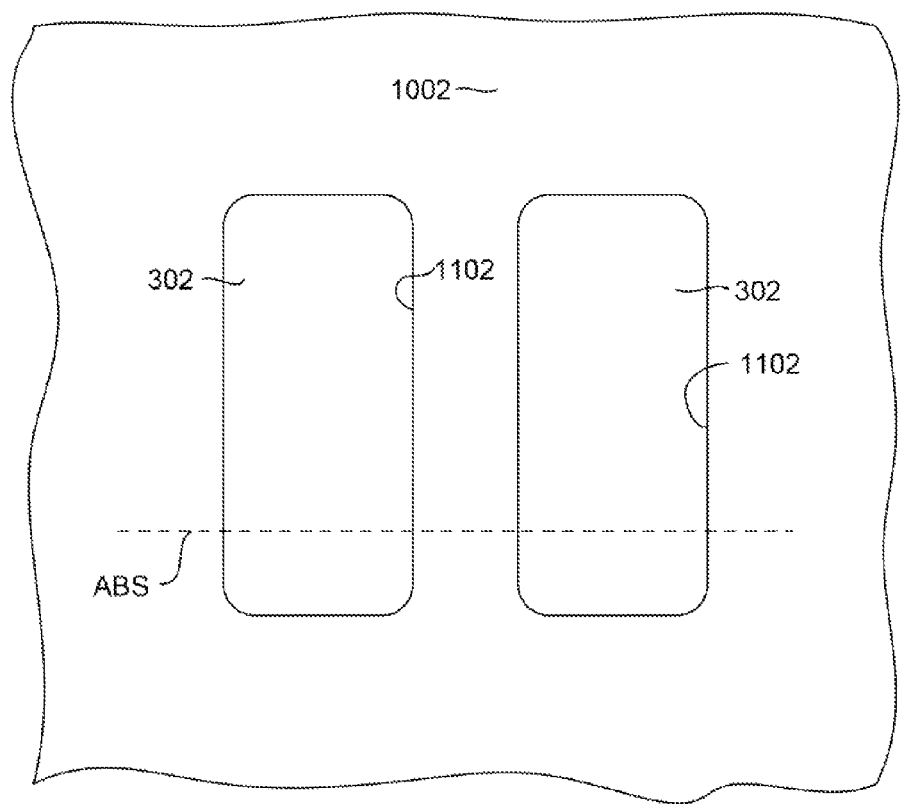
Figure 12:
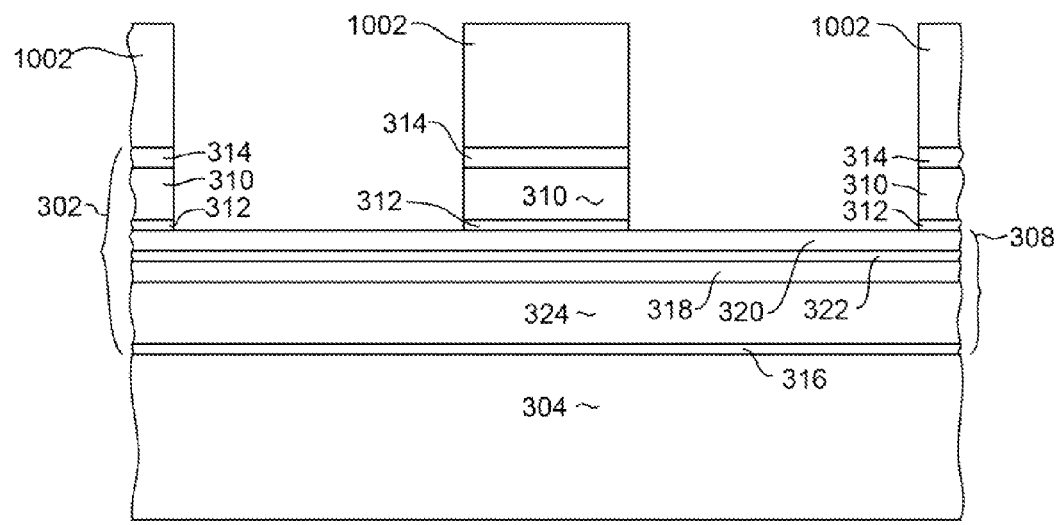

The first mask structure 1002 can be formed of a photolithographically patterned photoresist mask, and can also include other layers, such as but not limited to one or more hard mask layers, adhesion layers, image transfer layers etc., not shown. The mask has openings, the configuration of which can be better understood with reference to FIG. 11, which shows a top down view as seen from line 11-11 of FIG. 10. In FIG. 11, it can be seen that the mask 1002 has openings 1102 through which the sensor stack layers 302 are exposed. The orientation of an intended air bearing surface plane is indicated by dashed line ABS to show the orientation of the mask 1002 and openings 1102. A space between the openings is configured to define a track-width of a sensor to be formed, as will be seen below. FIG. 12 shows a cross sectional view of along a plane parallel with the ABS as taken from line 12-12 of FIG. 11. As shown in FIG. 12, with the mask 1002 formed, over the sensor stack layers 302, a material removal process such as ion milling is performed just sufficiently to remove portions of the free layer 310 that are not protected by the mask, and possibly a portion of the barrier or spacer layer, leaving at least a portion of the pinned layer structure 308 intact. This process defines the functional track-width of the sensor by defining a width of the free layer structure 310. After this first material removal process has been performed, the first mask 1002 can be removed.

Figure 13:
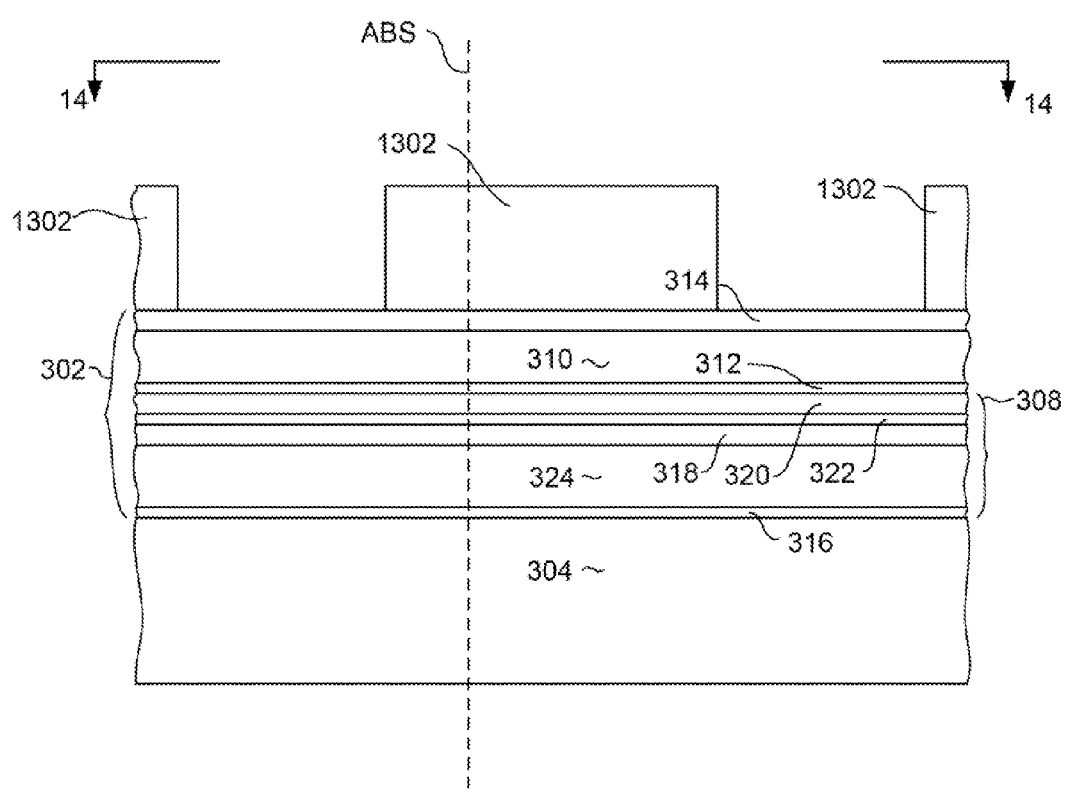
Figure 14:
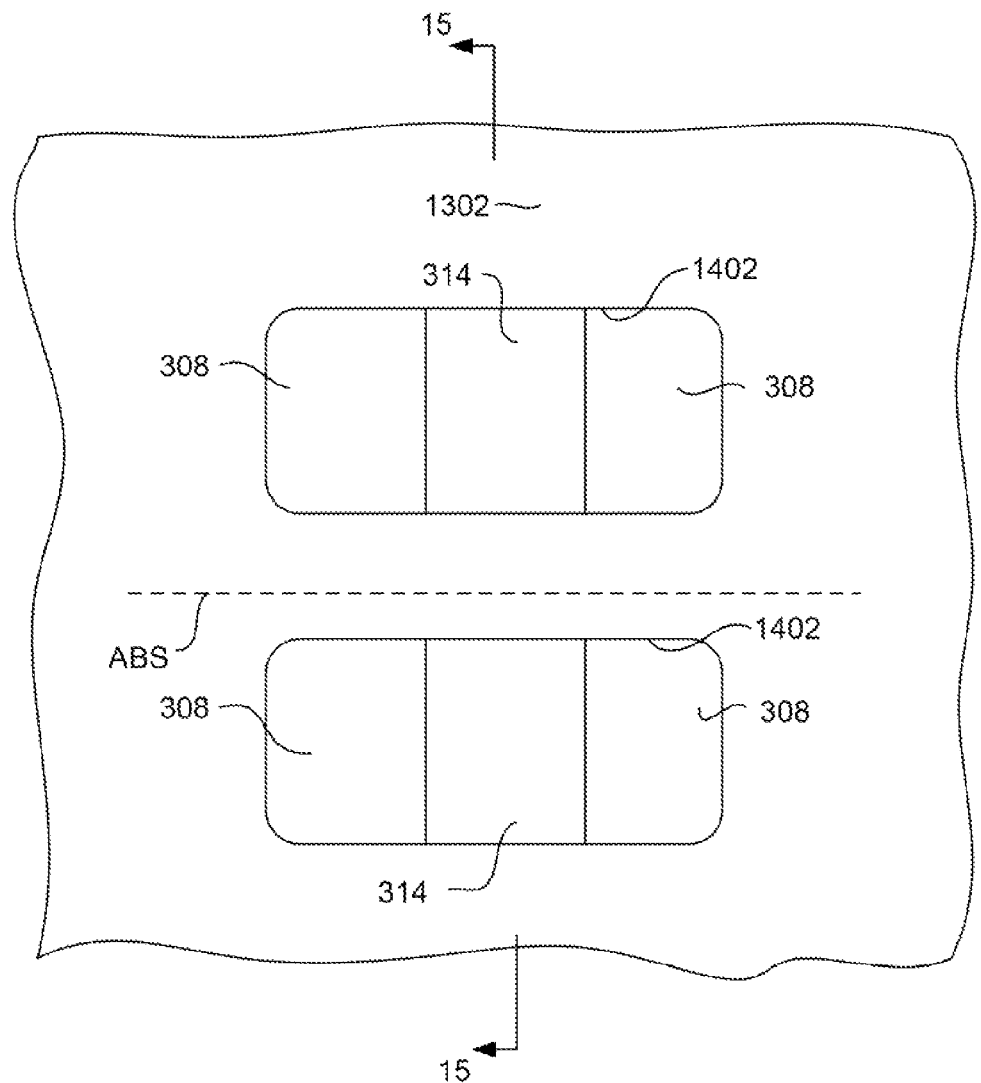
Figure 15:
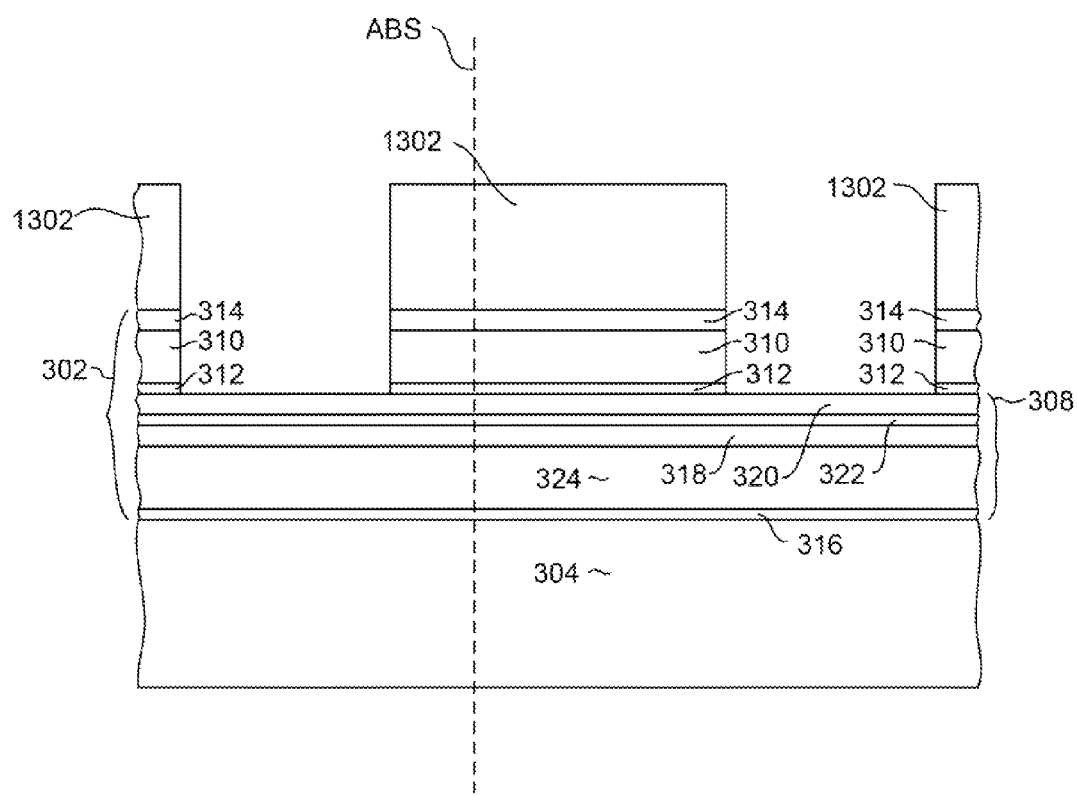

With reference now to FIG. 13, a second mask structure 1302 can be formed. This mask 1302 is a stripe height defining mask, the configuration of which can be better seen with reference to FIG. 14 which shows a top down view as seen from line 14-14 of FIG. 13. In FIG. 14 it can be seen that the mask 1302 has a pair of openings 1402 located in front of and behind the air bearing surface plane ABS. This second mask 1302 is a stripe height defining mask structure. Also, as can be seen, the material exposed through the openings 1402 includes a portion where the cap layer 314 (and free layer there-below) remain. The material exposed through the openings also includes the pinned layer structure 308 in regions where the free layer 310 and cap layer 314 were removed in the previously described masking and milling processes.

With the second mask 1302 in place, a second material removal process such as ion milling is performed to remove material not protected by the second mask structure 1302. The material removal process is performed to remove exposed portions of the free layer, leaving the under-lying pinned layer structure 308 intact. This can be seen more clearly in FIG. 15 which shows a cross sectional view as seen from line 15-15 of FIG. 14, along a plane that is perpendicular to the air bearing surface plane ABS. After this second material removal process has been performed, the second mask 1302 can be removed.

Figure 16:
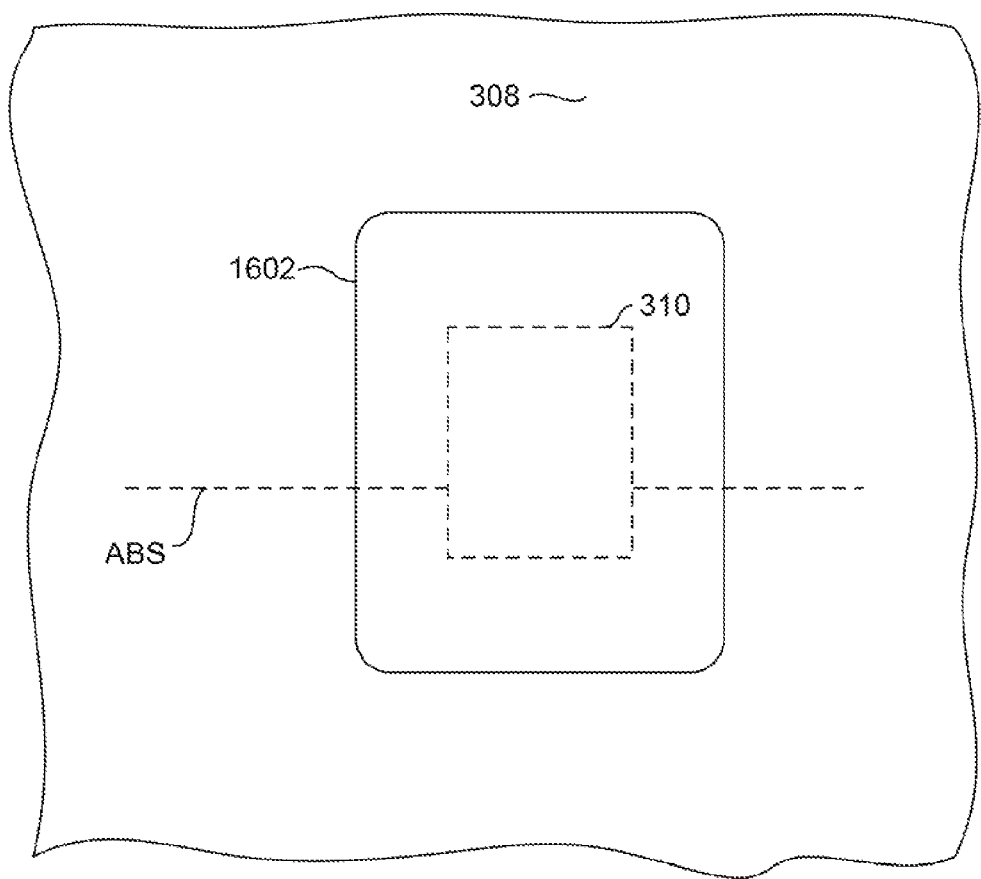
Figure 17:
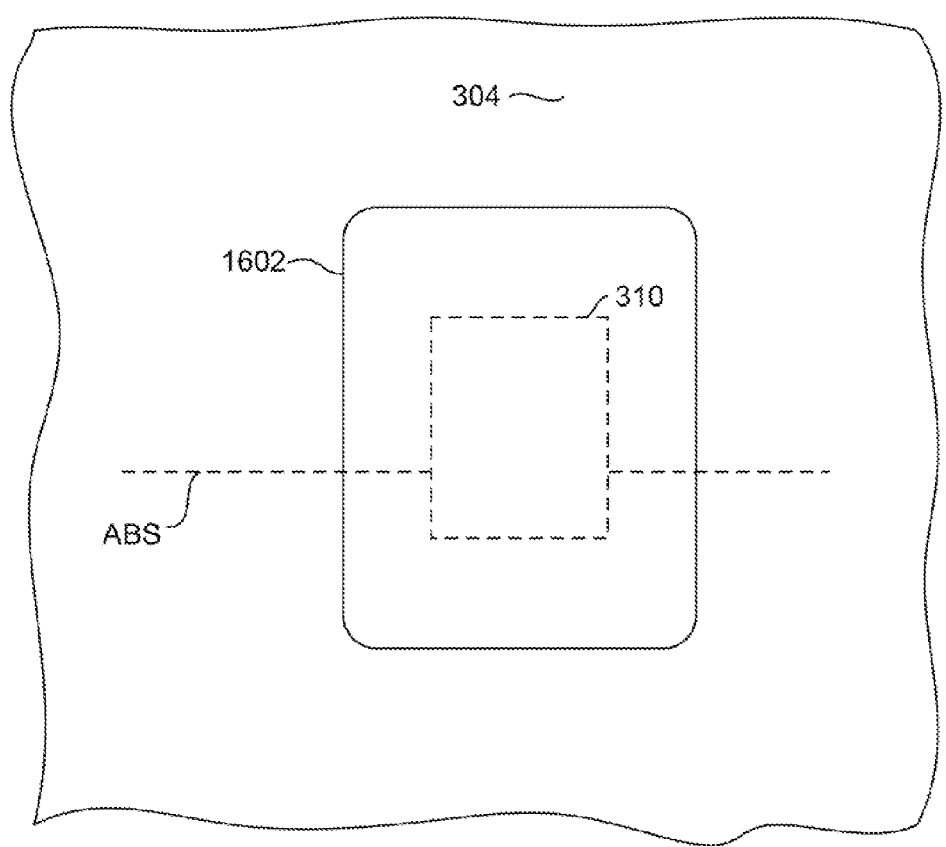

FIG. 16 shows a top down view. As shown in FIG. 16, a third mask structure 1602 is formed. This mask 1602 covers an area over the remaining free layer 310 (that which remains after the previous two masking and milling processes) and covers an area slightly beyond this remaining free layer 310, leaving a further removed portion of the pinned layer structure 308 exposed. A third material removal process, such as ion milling, is performed to remove portions of the pinned layer structure 308 that are not protected by the mask 1602. This material removal process can be performed until the under-lying shield structure 304 is exposed, leaving a structure as shown in FIG. 17. The third mask 1602 can then be removed. This third masking and milling step defines the outer edges of the extended pinned layer structure, which (when manufactured by the previously described process) can be extended in both the track-width direction as well as the stripe height direction.

In addition however, the above described process can be used to form a shape enhanced pinned layer that extends beyond the free layer in only the track width direction (not stripe height direction) or only in the stripe height direction (not in the track-width direction). Also, it should be pointed out that the order of the first and second masking and milling operations can be reversed so that the stripe height defining masking and milling processes are performed prior to the track-width defining masking and milling process.

The order of the masking and milling processes, such as for SH first then TW second or vice versa, has a direct affect on the shape of the soft bias. For purposes of this discussion, the three milling steps described above will be defined as: K3 for defining the stripe height (SH); K5 for defining the track width (TW); and K1 for defining the pinned layer shape (e.g. extended pinned layer). For semi-wrap around pinned layer (K3 SEP and K5 SEP), if K5 is done first then K3 follow by K1, the soft bias SH is defined by K3, and the resulting soft bias stripe height SH is short. If K3 is done first, then K5 follow by K1, the soft bias SH is defined by K5 and hence longer—softbias SH is longer. For the embodiments shown above, K5 SEP only may be desired. In that case the same rule applies. K5 first will have shorter Softbias SH than K3 first. The claims for extended pinned should cover K5 SEP only and K5SEP with K3 SEP for semi-wrap-around SEP. The preferred flow for build is K5 first for both K5 SEP only and K5 SEP with K3 SEP.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic read head, comprising:
a sensor stack that includes a magnetic free layer structure and a magnetic pinned layer structure, the magnetic free layer structure having a back edge that extends from an air bearing surface to a first stripe height and having first and second laterally opposed sides the distance between which defines a track-width, and wherein the magnetic pinned layer structure has a back edge that extends significantly beyond the first stripe height and also extends laterally significantly beyond the first and second sides of the magnetic free layer;
first and second soft magnetic bias structures extending laterally outward from the first and second sides of the free layer structure; and
a leading magnetic shield and a trailing magnetic shield, the sensor stack being sandwiched between the leading magnetic shield and the trailing magnetic shield;
wherein each of the first and second soft magnetic bias structures is magnetically coupled with the trailing magnetic shield.

2. The magnetic read head as in claim 1, wherein at least a portion of the first and second soft magnetic bias structures is located between the magnetic pinned layer structure and the trailing magnetic shield.

3. The magnetic read head as in claim 1, wherein each of the first and second soft magnetic bias structures includes first and second magnetic layers, the first magnetic layer having a higher magnetic saturation than the second magnetic layer.

4. The magnetic read head as in claim 1, wherein each of the first and second soft magnetic bias structures includes first and second magnetic layers the first magnetic layer having a higher magnetic saturation than the second magnetic layer, the first and second magnetic layers being magnetically anti-parallel coupled with one another across a non-magnetic anti-parallel coupling layer.

5. The magnetic read head as in claim 1, wherein each of the first and second soft magnetic bias structures comprises one or more of NiFe19, NiFe4, NiFe 19/NiFe4, NiFe4/ NiFe19, NiFe17Mo5, NiFe55, NiFe19/NiFeMo, NiFeMo/ NiFe19, CoFe25.

6. The magnetic read head as in claim 1, wherein at least a portion of each of the first and second soft magnetic bias structures is exchange coupled with a layer of antiferromagnetic material.

7. The magnetic read head as in claim 6, wherein the layer of anti-ferromagnetic material comprises a layer of IrMn.

8. The magnetic read head as in claim 1, wherein the trailing magnetic shield comprises a magnetic layer that is exchange coupled with a layer of anti-ferromagnetic material.

9. The magnetic read head as in claim 1, wherein the trailing magnetic shield structure comprises first and second magnetic layers and a layer of antiferromagnetic material located between the first and second magnetic layers.

10. The magnetic read head as in claim 1, wherein the trailing magnetic shield structure comprises first and second magnetic layers, the first magnetic layer being located closer to the soft magnetic bias structure than is the second magnetic layer, the first magnetic layer being constructed of a material having a high magnetic saturation and being exchange coupled with a layer of anti-ferromagnetic material, the read head further comprising an anti-parallel coupling layer located between the first magnetic layer and the first and second soft magnetic bias structures.

11. The magnetic sensor as in claim 10, wherein each of the first and second soft magnetic bias structures includes first and second magnetic layers that are anti-parallel coupled with one another.

12. A magnetic read head, comprising:
a sensor stack that includes a magnetic free layer structure and a magnetic pinned layer structure, the magnetic free layer structure having a back edge that extends from an air bearing surface to a first stripe height and having first and second laterally opposed sides the distance between which defines a track-width, and wherein the magnetic pinned layer structure has a back edge that extends significantly beyond the first stripe height and also extends laterally significantly beyond the first and second sides of the magnetic free layer; and
first and second soft magnetic bias structures extending laterally outward from the first and second sides of the free layer structure;
wherein at least a portion of each of the first and second soft magnetic bias structures is magnetically anti-parallel coupled with the trailing magnetic shield.

13. A magnetic data storage system, comprising:
a housing;
a magnetic media mounted within the housing;
an actuator mounted within the housing;
a slider connected with the actuator for movement adjacent to a surface of the magnetic media; and
a magnetic read head formed on the slider, the magnetic read hear further comprising:
a sensor stack that includes a magnetic free layer structure and a magnetic pinned layer structure, the magnetic free layer structure having a back edge that extends from an air bearing surface to a first stripe height and having first and second laterally opposed sides the distance between which defines a track-width, and wherein the magnetic pinned layer structure has a back edge that extends significantly beyond the first stripe height and also extends laterally significantly beyond the first and second sides of the free layer;

first and second soft magnetic bias structures extending laterally outward from the first and second sides of the free layer structure; and a leading magnetic shield and a trailing magnetic shield, the sensor stack being sandwiched between the leading magnetic shield and the trailing magnetic shield; wherein:

at least a portion of the first and second soft magnetic bias structures is located between the magnetic pinned layer structure and the trailing magnetic shield; and each of the first and second soft magnetic bias structures is magnetically coupled with the trailing magnetic shield.

14. The magnetic data storage system as in claim 13, wherein at least a portion of the first and second soft magnetic bias structures is located between the pinned layer structure and the trailing magnetic shield.

15. A magnetic data storage system, comprising:
a housing;
a magnetic media mounted within the housing;
an actuator mounted within the housing;
a slider connected with the actuator for movement adjacent to a surface of the magnetic media; and
a magnetic read head formed on the slider, the magnetic read hear further comprising:
a sensor stack that includes a magnetic free layer structure and a magnetic pinned layer structure, the magnetic free layer structure having a back edge that extends from an air bearing surface to a first stripe height and having first and second laterally opposed sides the distance between which defines a track-width, and wherein the magnetic pinned layer structure has a back edge that extends significantly beyond the first stripe height and also extends laterally significantly beyond the first and second sides of the free layer;
first and second soft magnetic bias structures extending laterally outward from the first and second sides of the free layer structure; and
a leading magnetic shield and a trailing magnetic shield, the sensor stack being sandwiched between the leading magnetic shield and the trailing magnetic shield; wherein:
wherein at least a portion of each of the soft magnetic bias structures is magnetically anti-parallel coupled with the trailing magnetic shield.

* * * * *